United States Patent
Huynh et al.

(10) Patent No.: US 11,943,142 B2
(45) Date of Patent: *Mar. 26, 2024

(54) HYBRID WILDCARD MATCH TABLE

(71) Applicant: Marvell Asia PTE, LTD, Singapore (SG)

(72) Inventors: Jeffrey T. Huynh, San Jose, CA (US); Weihuang Wang, Los Gatos, CA (US); Tsahi Daniel, Palo Alto, CA (US); Srinath Atluri, Fremont, CA (US); Mohan Balan, TamilNadu (IN)

(73) Assignee: MARVELL ASIA PTE, LTD, Singapore (SG)

( * ) Notice: Subject to any disclaimer, the term of this patent is extended or adjusted under 35 U.S.C. 154(b) by 148 days.

This patent is subject to a terminal disclaimer.

(21) Appl. No.: 17/534,294

(22) Filed: Nov. 23, 2021

(65) Prior Publication Data

US 2022/0086089 A1  Mar. 17, 2022

Related U.S. Application Data

(63) Continuation of application No. 14/932,791, filed on Nov. 4, 2015, now Pat. No. 11,218,410, which is a (Continued)

(51) Int. Cl.
*G06F 12/00* (2006.01)
*G11C 15/00* (2006.01)
(Continued)

(52) U.S. Cl.
CPC ........ *H04L 45/74591* (2022.05); *G11C 15/00* (2013.01); *H04L 45/54* (2013.01); *H04L 69/22* (2013.01)

(58) Field of Classification Search
CPC ..... H04L 45/54; H04L 45/38; H04L 45/7453; H04L 45/74591; H04L 49/25; H04L 45/7452; G06F 16/9014; G06F 16/2255
(Continued)

(56) References Cited

U.S. PATENT DOCUMENTS 6,226,710 B1   5/2001  Melchior
7,554,980 B1 *  6/2009  Yeh .................. H04L 45/54
                                             707/999.001

(Continued)

FOREIGN PATENT DOCUMENTS

CN   1953418 A   4/2007
CN   102591947 A  7/2012
CN   102880724 A  1/2013

OTHER PUBLICATIONS

The Office Action dated Jan. 28, 2019 for the TW Application 104134823.
(Continued)

*Primary Examiner* — Khaled M Kassim
*Assistant Examiner* — Jason A Harley

(57) ABSTRACT

Embodiments of the present invention are directed to a wildcard matching solution that uses a combination of static random access memories (SRAMs) and ternary content addressable memories (TCAMs) in a hybrid solution. In particular, the wildcard matching solution uses a plurality of SRAM pools for lookup and a spillover TCAM pool for unresolved hash conflicts.

43 Claims, 8 Drawing Sheets

Related U.S. Application Data continuation-in-part of application No. 14/536,937, filed on Nov. 10, 2014, now Pat. No. 10,116,564.

(51) Int. Cl.
*H03M 7/42* (2006.01)
*H04J 1/16* (2006.01)
*H04L 9/08* (2006.01)
*H04L 12/54* (2022.01)
*H04L 45/00* (2022.01)
*H04L 45/745* (2022.01)
*H04L 45/7453* (2022.01)
*H04L 69/22* (2022.01)

(58) Field of Classification Search
USPC .................................. 370/395.32, 395.31
See application file for complete search history.

(56) References Cited

U.S. PATENT DOCUMENTS

| | | |
|---|---|---|
| 7,805,393 B1 | 9/2010 | Venkatachary et al. |
| 8,355,269 B1 | 1/2013 | Zampaglione |
| 2002/0146009 A1 | 10/2002 | Gupta |
| 2003/0191740 A1 | 10/2003 | Stark |
| 2003/0194740 A1* | 10/2003 | Williams .............. C07D 209/12 435/6.12 |
| 2005/0174272 A1 | 8/2005 | Cadambi |
| 2006/0116989 A1 | 6/2006 | Bellamkonda |
| 2006/0259508 A1 | 11/2006 | Sikdar |
| 2007/0168600 A1 | 7/2007 | Anthony, Jr. |
| 2008/0080539 A1* | 4/2008 | Hong .................. H04L 45/7453 370/402 |
| 2008/0085539 A1 | 4/2008 | Scholler |
| 2008/0270708 A1 | 10/2008 | Warner |
| 2009/0012958 A1 | 1/2009 | Raj |
| 2009/0044106 A1* | 2/2009 | Berkner ................ G06F 40/103 707/999.102 |
| 2009/0199266 A1 | 8/2009 | Kling et al. |
| 2010/0287160 A1 | 11/2010 | Pendar |
| 2010/0293338 A1* | 11/2010 | Krishnaprasad .... G06F 16/9014 711/E12.001 |
| 2011/0296124 A1 | 12/2011 | Fredenberg |
| 2012/0323972 A1 | 12/2012 | Ostrovsky |
| 2013/0034100 A1 | 2/2013 | Goyal |
| 2013/0142042 A1 | 6/2013 | Garcia Martin |
| 2014/0003112 A1* | 1/2014 | Sun ........................ G11C 15/00 365/49.17 |
| 2014/0040518 A1 | 2/2014 | Udipi et al. |
| 2014/0082156 A1 | 3/2014 | Jagtap |
| 2014/0122791 A1 | 5/2014 | Fingerhut et al. |
| 2014/0269690 A1* | 9/2014 | Tu ........................ H04L 45/021 370/389 |
| 2014/0269718 A1 | 9/2014 | Goyal |
| 2014/0321467 A1 | 10/2014 | Wang |
| 2015/0039823 A1 | 2/2015 | Chen |
| 2015/0256397 A1 | 9/2015 | Agarwal |
| 2015/0333929 A1 | 11/2015 | Le |
| 2016/0020992 A1 | 1/2016 | Wu et al. |
| 2016/0028631 A1 | 1/2016 | Yishay |

OTHER PUBLICATIONS

The Chinese Office Action dated Feb. 25, 2020 for the Chinese Patent Application No. 2015107573136.

The Office Action dated Aug. 5, 2020 for the Chinese Patent Application No. 201510757313.6.

* cited by examiner

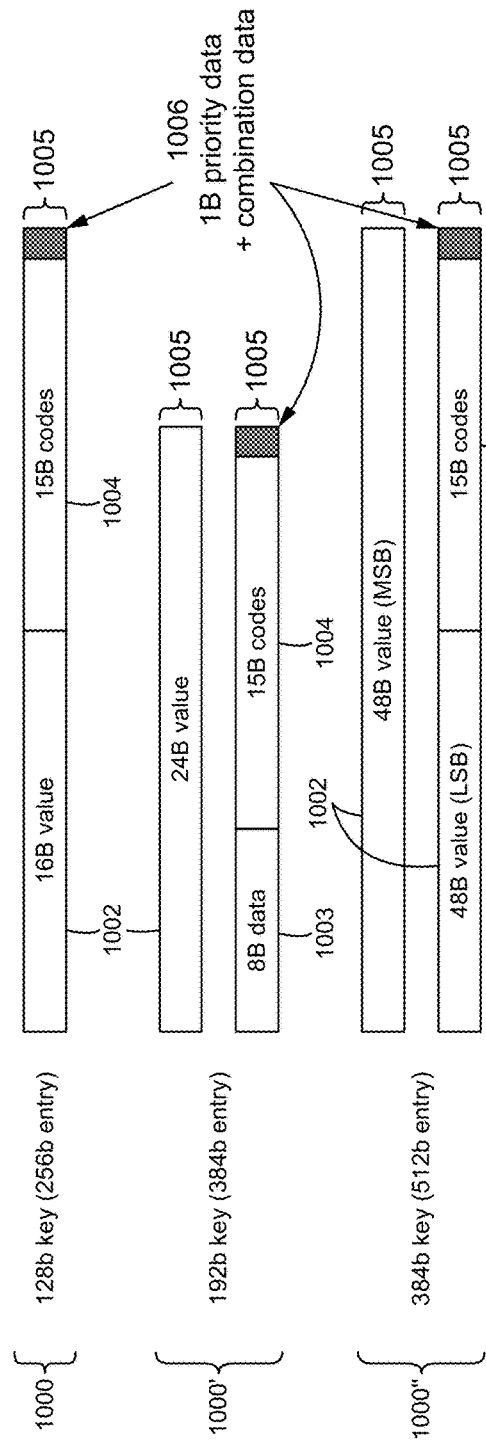
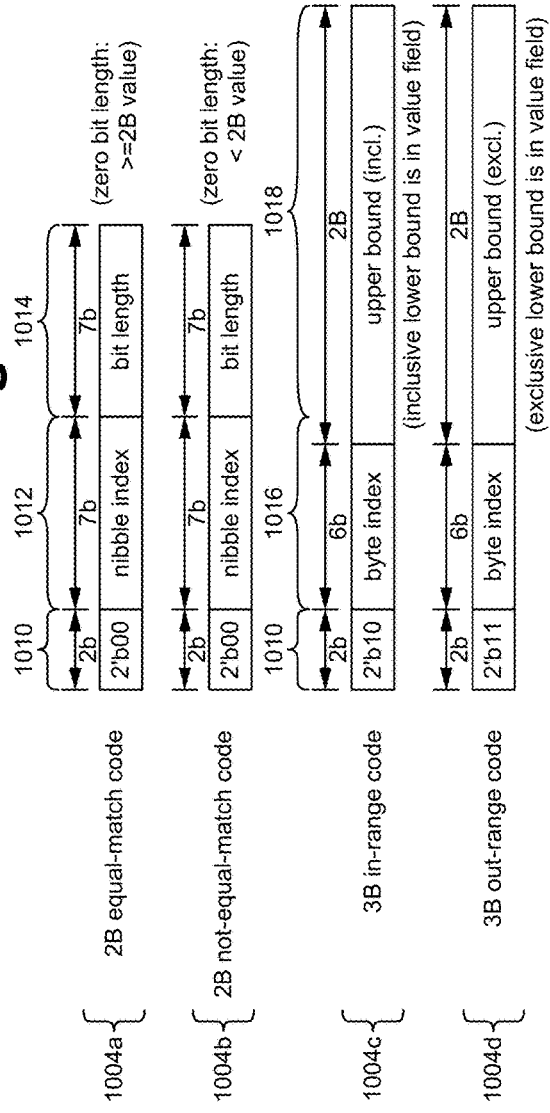
Fig. 10A
Fig. 10B

HYBRID WILDCARD MATCH TABLE

RELATED APPLICATIONS

This application is a continuation of the co-pending U.S. patent application Ser. No. 14/932,791, filed Nov. 4, 2015, and entitled "HYBRID WILDCARD MATCH TABLE," which is a continuation-in-part of the co-pending U.S. patent application Ser. No. 14/536,937, filed Nov. 10, 2014, and entitled "HYBRID WILDCARD MATCH TABLE," which claims priority under 35 U.S.C. § 119(e) of the co-pending U.S. provisional patent application serial No. 62/236,134, filed Oct. 1, 2015, and entitled "HYBRID WILDCARD MATCH TABLE," all of which are hereby incorporated by reference.

FIELD OF INVENTION

The present invention relates to wildcard matching. More particularly, the present invention relates to a hybrid wildcard match table.

BACKGROUND OF THE INVENTION

A network device classifies packets into different flows using wildcard matching. Ternary content addressable memory (TCAM) is traditionally used to perform wildcard matching because of its speed and simplicity. However, high cost and high power consumption are major drawbacks of TCAM-based wildcard matching engines.

BRIEF SUMMARY OF THE INVENTION

Embodiments of the present invention are directed to a wildcard matching solution that uses a combination of static random access memories (SRAMs) and ternary content addressable memories (TCAMs) in a hybrid solution. In particular, the wildcard matching solution uses a plurality of SRAM pools for lookup and a spillover TCAM pool for unresolved hash conflicts.

A first aspect is directed to a network switch. The network switch comprises an SRAM entry table including a plurality of entries that are each associated with a different matching rule, wherein each of the entries comprise a code field including one or more codes, a value field including rule comparison data and a priority field that indicates a priority of the entry with respect to other of the plurality of entries, a plurality of SRAM pools, at least one spillover TCAM pool and a request interface control logic dispatching a search key to one or more active pools of the plurality of SRAM pools and the at least one spillover TCAM pool and returning results data that is based on whether the search key matched the rule of one or more of the entries. In some embodiments, each of the codes occupies either 2 bytes or 3 bytes of the code field. In some embodiments, at least one of the codes is an equal-match type code or a not-equal-match type code, the at least one of the codes comprising an identifier that distinguishes the at least one of the codes from other types of the codes, a nibble index that identifies a location of match data to compare within both the search key and the value field and a bit length that indicates a number of bits after the location within both the search key and the value field to compare as the data, wherein the at least one of the codes relates to determining if the match data of the search key is the same as the match data from the value field. In some embodiments, at least another one of the codes is an in-range type code or a not-in-range type code, the at least another one of the codes comprising an identifier that distinguishes the at least another one of the codes from the other types of the codes, a byte index that identifies a location of data relating to a lower boundary of the at least another one of the codes within the value field and a location of target data within the search key and an upper boundary field that includes data relating to an upper boundary of the at least another one of the codes, wherein the at least another one of the codes relates to determining if the target data is within or outside of the upper boundary and the lower boundary. In some embodiments, the at least one of the codes occupies 2 bytes of the code field and the at least another one of the codes occupies 3 bytes of the code field. In some embodiments, the priority field further comprises combination data that indicates what combination of results of evaluating each of the codes of the rule with respect to the search key qualify as the search key matching the entry. In some embodiments, each of the at least another one of the codes is limited to a predetermined maximum bit size range that is less than a desired bit size range, and further wherein the combination data is based on an in-range type code for the desired bit size range or an out-of-range type code for the desired bit size such that the combination data indicates a logical combination of a plurality of the codes of the entry that when evaluated results in output that is equivalent to the in-range type code for the desired bit size range or the out-of-range type code for the desired bit size.

In some embodiments, a hybrid wildcard match (WCM) table is accessible by the plurality of SRAM pools, the at least one spillover TCAM pool, and the request interface control logic. In some embodiments, the hybrid WCM includes configurations for the plurality of SRAM pools, the at least one spillover TCAM pool, and the request interface control logic. In some embodiments, the configurations identify which of the plurality of SRAM pools and the at least one spillover TCAM pool are the one or more active pools. In some embodiments, arbitration takes place to determine which of the one or more active pools has priority to return the results data.

A second aspect is directed to a method of implementing a network switch that includes a plurality of SRAM pools and at least one spillover TCAM pool. The method comprises receiving an entry to be inserted into one of the pools, determining whether or not the entry is hashable, based on the determination that the entry is hashable, inserting the entry into one of the plurality of SRAM pools, wherein the entry as inserted into the plurality of SRAM pools comprises a code field including one or more codes, a value field including rule comparison data and a priority field that indicates a priority of the entry with respect to other entries within one of the pools and based on the determination that the entry is not hashable, inserting the entry into the spillover TCAM pool. In some embodiments, each of the codes occupies either 2 bytes or 3 bytes of the code field. In some embodiments, at least one of the codes is an equal-match type code or a not-equal-match type code, the at least one of the codes comprising an identifier that distinguishes the at least one of the codes from other types of the codes, a nibble index that identifies a location of match data to compare within both the search key and the value field and a bit length that indicates a number of bits after the location within both the search key and the value field to compare as the data, wherein the at least one of the codes relates to determining if the match data of the search key is the same as the match data from the value field.

In some embodiments, at least another one of the codes is an in-range type code or a not-in-range type code, the at least another one of the codes comprising an identifier that distinguishes the at least another one of the codes from the other types of the codes, a byte index that identifies a location of data relating to a lower boundary of the at least another one of the codes within the value field and a location of target data within the search key and an upper boundary field that includes data relating to an upper boundary of the at least another one of the codes, wherein the at least another one of the codes relates to determining if the target data is within or outside of the upper boundary and the lower boundary. In some embodiments, the at least one of the codes occupies 2 bytes of the code field and the at least another one of the codes occupies 3 bytes of the code field. In some embodiments, the priority field further comprises combination data that indicates what combination of results of evaluating each of the codes of the rule with respect to the search key qualify as the search key matching the entry. In some embodiments, each of the at least another one of the codes is limited to a predetermined maximum bit size range that is less than a desired bit size range, and further wherein the combination data is based on an in-range type code for the desired bit size range or an out-of-range type code for the desired bit size such that the combination data indicates a logical combination of a plurality of the codes of the entry that when evaluated results in output that is equivalent to the in-range type code for the desired bit size range or the out-of-range type code for the desired bit size.

In some embodiments, determining whether or not the entry is hashable includes comparing a key_map with the entry, wherein the key_map masks bits of the entry that participates in hashing. In some embodiments, inserting the entry into one of the plurality of SRAM pools includes rehashing to resolve a hash conflict. In some embodiments, rehashing implements a depth-first insertion algorithm or a breadth-first insertion algorithm.

A third aspect is directed to a method of implementing a network switch that includes a plurality of SRAM pools and at least one spillover TCAM pool, wherein each entry of the SRAM pools includes a code field including one or more codes, a value field including rule comparison data and a priority field that indicates a priority of the entry with respect to other entries within one of the SRAM pools. The method comprises receiving a search key at a request interface control logic, based on a hybrid wildcard match (WCM) table, dispatching the search key to one or more active pools, at each of the active pools that is one of the SRAM pools masking the search key according to a mask associated with the SRAM pool and hashing the masked search key into a hash key, selecting one of the entries within the SRAM pool based on the hash key, evaluating each of the codes of the one of the entries based on the search key and the value field thereby determining which of the codes are satisfied by the search key and determining if the search key is a match for the one of the entries based on a combination of the codes that are satisfied by the search key, returning a first set of results that includes data and priority information with the spillover TCAM pool when the one or more active pools include the spillover TCAM pool, returning a second set of results by each active SRAM pool of the active pools when the active pools include at least one of the plurality of SRAM pools, wherein the second set of results of each of the active SRAM pools includes data indicating whether the search key matched the one of the entries of the active SRAM pool and priority information from the priority field of the one of the entries of the active SRAM pool, performing a second level arbitration of all sets of results returned by the one or more active pools based on priority and based on the second level arbitration, outputting data from the set with the highest priority.

In some embodiments, each of the codes occupies either 2 bytes or 3 bytes of the code field. In some embodiments, at least one of the codes is an equal-match type code or a not-equal-match type code, the at least one of the codes comprising an identifier that distinguishes the at least one of the codes from other types of the codes, a nibble index that identifies a location of match data to compare within both the search key and the value field and a bit length that indicates a number of bits after the location within both the search key and the value field to compare as the data, wherein the at least one of the codes relates to determining if the match data of the search key is the same as the match data from the value field. In some embodiments, at least another one of the codes is an in-range type code or a not-in-range type code, the at least another one of the codes comprising an identifier that distinguishes the at least another one of the codes from the other types of the codes, a byte index that identifies a location of data relating to a lower boundary of the at least another one of the codes within the value field and a location of target data within the search key and an upper boundary field that includes data relating to an upper boundary of the at least another one of the codes, wherein the at least another one of the codes relates to determining if the target data is within or outside of the upper boundary and the lower boundary.

In some embodiments, the at least one of the codes occupies 2 bytes of the code field and the at least another one of the codes occupies 3 bytes of the code field. In some embodiments, the priority field further comprises combination data that indicates what combination of results of evaluating each of the codes of the rule with respect to the search key qualify as the search key matching the entry. In some embodiments, each of the at least another one of the codes is limited to a predetermined maximum bit size range that is less than a desired bit size range, and further wherein the combination data is based on an in-range type code for the desired bit size range or an out-of-range type code for the desired bit size such that the combination data indicates a logical combination of a plurality of the codes of the entry that when evaluated results in output that is equivalent to the in-range type code for the desired bit size range or the out-of-range type code for the desired bit size. In some embodiments, configurations of the hybrid WCM table indicate which of the pools are the one or more active pools. In some embodiments, lookups in the one or more active pools are performed simultaneously.

A fourth aspect is directed to a memory structure for use with a network switch. The memory structure comprises a plurality of SRAM pools storing an SRAM entry table including a plurality of entries that are each associated with a different matching rule, wherein each of the entries comprise a code field including one or more codes, a value field including rule comparison data and a priority field that indicates a priority of the entry with respect to other of the plurality of entries and at least one spillover TCAM pool storing unhashable entries, wherein the memory structure interfaces with a request interface control logic configured to receive a search key of a packet arriving at the network switch and return results data that is based on whether the search key matched the rule of one or more of the entries. In some embodiments, each of the codes occupies either 2 bytes or 3 bytes of the code field. In some embodiments, at least one of the codes is an equal-match type code or a not-equal-match type code, the at least one of the codes comprising an identifier that distinguishes the at least one of the codes from other types of the codes, a nibble index that identifies a location of match data to compare within both the search key and the value field and a bit length that indicates a number of bits after the location within both the search key and the value field to compare as the data, wherein the at least one of the codes relates to determining if the match data of the search key is the same as the match data from the value field.

In some embodiments, at least another one of the codes is an in-range type code or a not-in-range type code, the at least another one of the codes comprising an identifier that distinguishes the at least another one of the codes from the other types of the codes, a byte index that identifies a location of data relating to a lower boundary of the at least another one of the codes within the value field and a location of target data within the search key and an upper boundary field that includes data relating to an upper boundary of the at least another one of the codes, wherein the at least another one of the codes relates to determining if the target data is within or outside of the upper boundary and the lower boundary. In some embodiments, the at least one of the codes occupies 2 bytes of the code field and the at least another one of the codes occupies 3 bytes of the code field. In some embodiments, the priority field further comprises combination data that indicates what combination of results of evaluating each of the codes of the rule with respect to the search key qualify as the search key matching the entry. In some embodiments, each of the at least another one of the codes is limited to a predetermined maximum bit size range that is less than a desired bit size range, and further wherein the combination data is based on an in-range type code for the desired bit size range or an out-of-range type code for the desired bit size such that the combination data indicates a logical combination of a plurality of the codes of the entry that when evaluated results in output that is equivalent to the in-range type code for the desired bit size range or the out-of-range type code for the desired bit size.

In some embodiments, the request interface control logic dispatches the search key to one or more active pools based on configurations of a hybrid wildcard match (WCM) table accessible by the request interface control logic, wherein the configurations identify which of the plurality of the SRAM pools and the at least one spillover TCAM pool are the one or more active pools. In some embodiments, final arbitration takes place to determine which of the one or more active pools has priority to return the results data. In some embodiments, each of the plurality of SRAM pools is configured to perform initial arbitration of all sets of results returned by each SRAM tile of a corresponding SRAM pool and to return a first data based on the initial arbitration and priority information for the first data. In some embodiments, each of the SRAM tiles is associated with a key_map and an entry is hashable when all bits in the entry that participate in hashing are not wildcards and not part of a range, and further wherein the key_map determines which bits in the entry participate in the hashing. In some embodiments, the search key is a combination of one or more header fields of the packet. In some embodiments, the at least one spillover TCAM also stores entries that cannot be inserted into the plurality of SRAM pools due to hash conflicts.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 10A illustrates formats of entries of an SRAM entry table according to some embodiments.

FIG. 10B illustrates four different types of codes that are able to be used for implementing an entry according to some embodiments.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein.

Figures 1, 2:
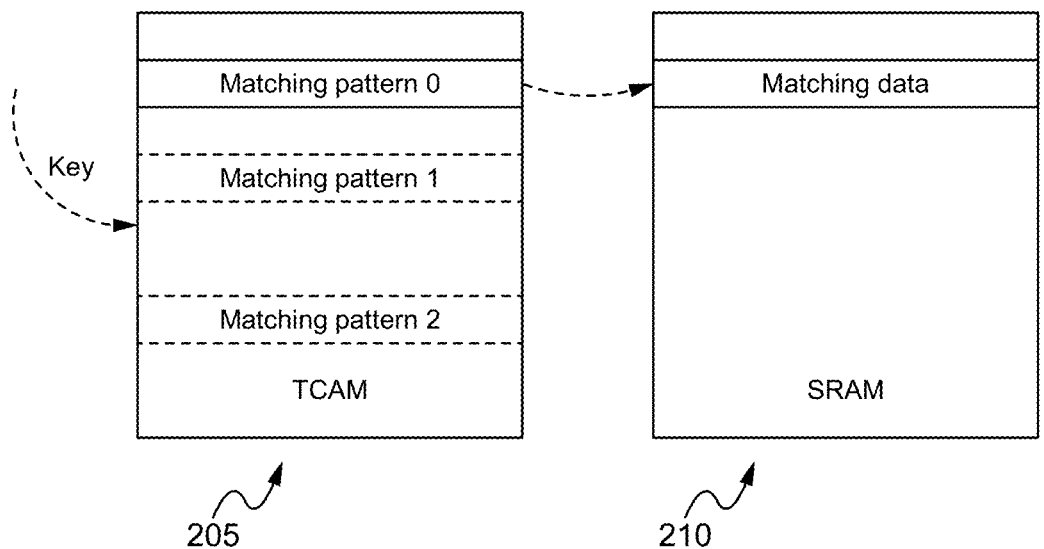
FIG. 1 illustrates an exemplary 5-dimensional packet matching rule.
FIG. 2 illustrates a TCAM-based solution.

FIG. 1 illustrates an exemplary 5-dimensional packet matching rule 100. The five dimensions refer to the five header fields: a source IP field (labeled as src.IP), a destination IP field (labeled as dest.IP), a source port field (labeled as src.port), a destination port field (labeled as dest.port), and a protocol field. The rule 100 includes a match key that is a combination of values, one for each header field. The rule 100 also includes control data that indicates a corresponding action to take when an incoming packet matches the match key.

Each field in the rule is allowed different types of matches, including exact match, wildcard match, prefix match (e.g. exact match followed by wildcard match) and range match. The use of wildcard (*) in a field with preceding values represents a prefix match, while the stand-alone use of wildcard in a field indicates that any arbitrary value can match. In FIG. 1, the source IP field and the destination IP field both include values that are prefix specifications, the source port field includes a value that is a wildcard specification, the destination port field includes a value that is a range specification, and the protocol field includes a value that is an exact match specification. The corresponding action associated with the match key of the rule 100 is drop, meaning that if a packet arriving at a network device, such as a network switch, matches the specifications or the match key of the rule 100, then the packet will be dropped by the network switch. Although the control data of the rule 100 includes a single action, the control data of a rule can include a plurality of actions.

As explained above, prior art network devices implement solutions that are based predominantly on ternary content addressable memory (TCAM). In these traditional solutions, as illustrated in FIG. 2, a key is indexed into TCAM 205, which performs parallel matching of all entries in the TCAM 205 and returns an address. The returned address is then indexed into an accompanying SRAM 210, which provides final data such as control data (e.g., drop).

The TCAM 205 has a built-in priority encoding scheme, meaning that the first matched entry is the final matched entry and is indexed into the SRAM 210. In other words, if multiple entries in the TCAM 205 match the key, then the TCAM 205 returns the address of the first matched entry in the TCAM 205. As such, priority is inherent based on the ordering of the entries in the TCAM 205. In FIG. 2, the key matches three entries in the TCAM 205. The address of the first matched entry (labeled as "Matching pattern 0") is returned and indexed into the SRAM 210, which returns the control data (labeled as "Matching data"). Although TCAM-based solutions are relatively fast to implement, these solutions have high cost and power consumption. In addition, these solutions are inefficient in handling range specifications and inserting new entries.

Embodiments of the present invention are directed to a wildcard matching solution that uses a combination of static random access memories (SRAMs) and ternary content addressable memories (TCAMs) in a hybrid solution. In particular, the wildcard matching solution uses a plurality of SRAM pools for lookup and a spillover TCAM pool for unresolved hash conflicts.

is configured to store entries that are not hashable as well as entries that cannot be inserted into the plurality of SRAM pools due to hash conflicts. Hashability of entries are further discussed below.

Figure 3:
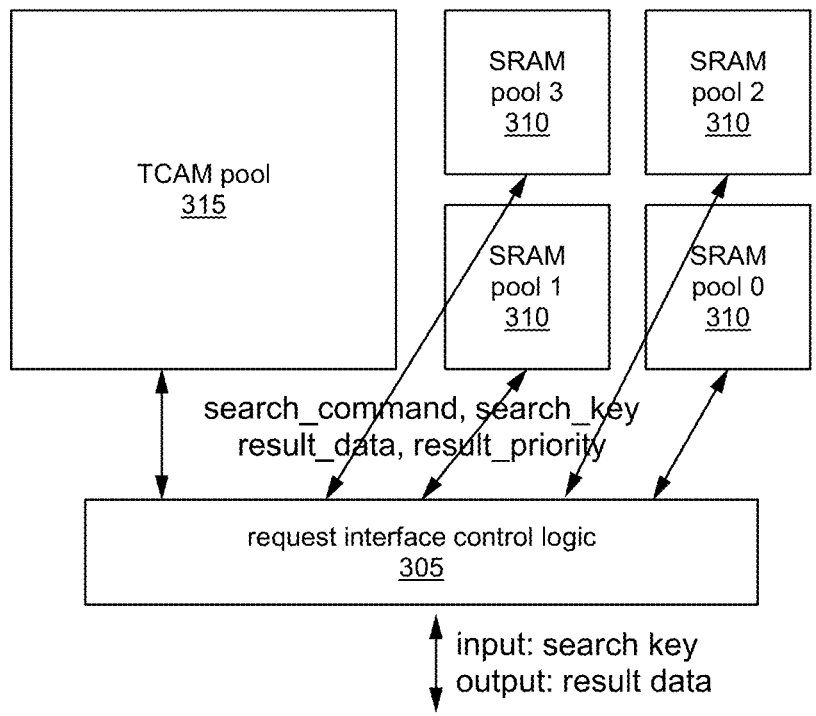
FIG. 3 illustrates an exemplary implementation of a wildcard matching solution in accordance with some embodiments.

FIG. 3 illustrates an exemplary implementation 300 of the wildcard matching solution in accordance with some embodiments. The implementation 300 includes a request interface control logic 305, a plurality of SRAM pools 310 and at least one spillover TCAM pool 315. In some embodiments, each SRAM pool 310 includes 16 SRAM tiles for parallel hashing, and the TCAM pool 315 includes a plurality of TCAM databases as a basic matching unit. Details of the SRAM pool 310 and the TCAM pool 315 are discussed below. Although FIG. 3 shows a single spillover TCAM pool, a plurality of spillover TCAM pools is contemplated. The implementation 300 of the wildcard matching solution is typically carried out on a network device, such as a network switch.

First, at a high level, a search request (e.g., search key) is received at the request interface control logic 305. Upon receiving the request, the control logic 305 dispatches the request data to one or more of the pools that are active, where local matching takes place. After each of the active pools performs local matching, the next level arbitration takes place to determine which of the active pools has the priority to return the final data (e.g., control data). The request interface control logic 305 or another logic in the network device performs the arbitration.

Table 1 lists exemplary configurations of a hybrid wildcard match (WMC) table. The hybrid WMC table resides in any of one or a combination of one or more of the SRAM pools 310 and the spillover TCAM pool 315. Alternatively or in addition to, the hybrid WMC table resides in another part of memory of the network device.

TABLE 1

| Field | Width | Description |
|---|---|---|
| Per Request Interface | | |
| tcam_pool_valid | 1 | Use spillover TCAM pool |
| sram_pool_bitmap | 4 | SRAM pools used |
| key_size | 4 | 128/192/384-bit key |
| data_size | 4 | In unit of byte |
| Per TCAM Pool | | |
| tcam_db_start | 3 | TCAM DB usage within this pool |
| tcam_db_end | 3 | |
| key_size | 4 | 128/192/384-bit key |
| data_size | 4 | In unit of byte |
| Per SRAM Pool | | |
| key_size | 2 | 128/192/384-bit key |
| key_tile_start | 4 | key_tile_start ≤ key_tile_end |
| key_tile_end | 4 | |
| entry_encode_mode | 16 | Pattern encoding mode, one bit per tile |
| key_map_way_{0 . . . 11} | 32 × 12 | Mask for bits that participates in hashing, 4/6/12-bit granularity for 128/192/384-bit key, respectively |
| data_size | 4 | In unit of byte |
| data_tile_start | 4 | data_tile_start ≤ data_tile_end ≤ 15 |
| data_tile_end | 4 | |

The wildcard matching solution is based on an observation made by the inventors regarding prefix specifications and range specifications. The observation, referring to FIG. 1, is that the most significant bits of each dimension are very likely to be an exact match and, hence, are hashable. In some embodiments, the plurality of SRAM pools is configured to store entries that are hashable and the spillover TCAM pool The hybrid WCM table is accessed by the request interface control logic 305, the SRAM pools 310 and the spillover TCAM pool 315 of FIG. 3 and provides each of the units 305-315 corresponding configurations or specifications. For example, the hybrid WCM table includes configurations for the request interface control logic 305 regarding whether to access the spillover TCAM pool, which of the SRAM pools to access, what the size of the key being compared is and what the size of the action being returned is. The hybrid WCM table also includes configurations for each spillover TCAM pool and for each SRAM pool. In some embodiments, the hybrid WCM table is automatically updated, manually updated via software, or both.

Figure 4:
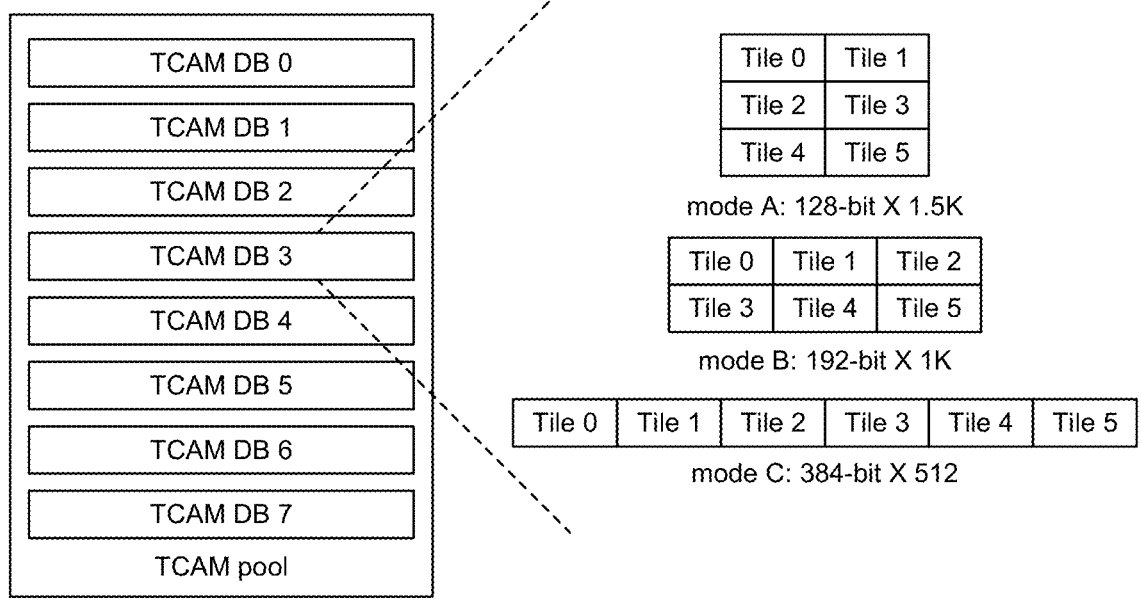
FIG. 4 illustrates an exemplary diagram of a TCAM pool in accordance with some embodiments.

FIG. 4 illustrates an exemplary diagram of a TCAM pool 400 in accordance with some embodiments. In some embodiments, the TCAM pool 315 of FIG. 3 is similarly configured as the TCAM pool 400. The TCAM pool 400 is organized into eight different databases. A database has six TCAM tiles, which are configurable into one of three different modes with different key sizes. In some embodiments, a TCAM tile is 64-bits wide and 512-entries deep, although other sizes are possible. However, based on this size, in one mode (mode A), the six TCAM tiles can be arranged as 128-bits wide by 1.5 k entries deep. In another mode (mode B), the six TCAM tiles can be arranged as 192-bits wide by 1 k entries deep. In yet another mode (mode C), the size TCAM tiles can be arranged as 384-bits wide by 512 entries deep. For each database, there is an accompanying dedicated SRAM for data return. The dedicated SRAM can be a part of the SRAM pools or separate from the SRAM pools. In some embodiments, a single dedicated SRAM is used for all eight databases.

Figure 5:
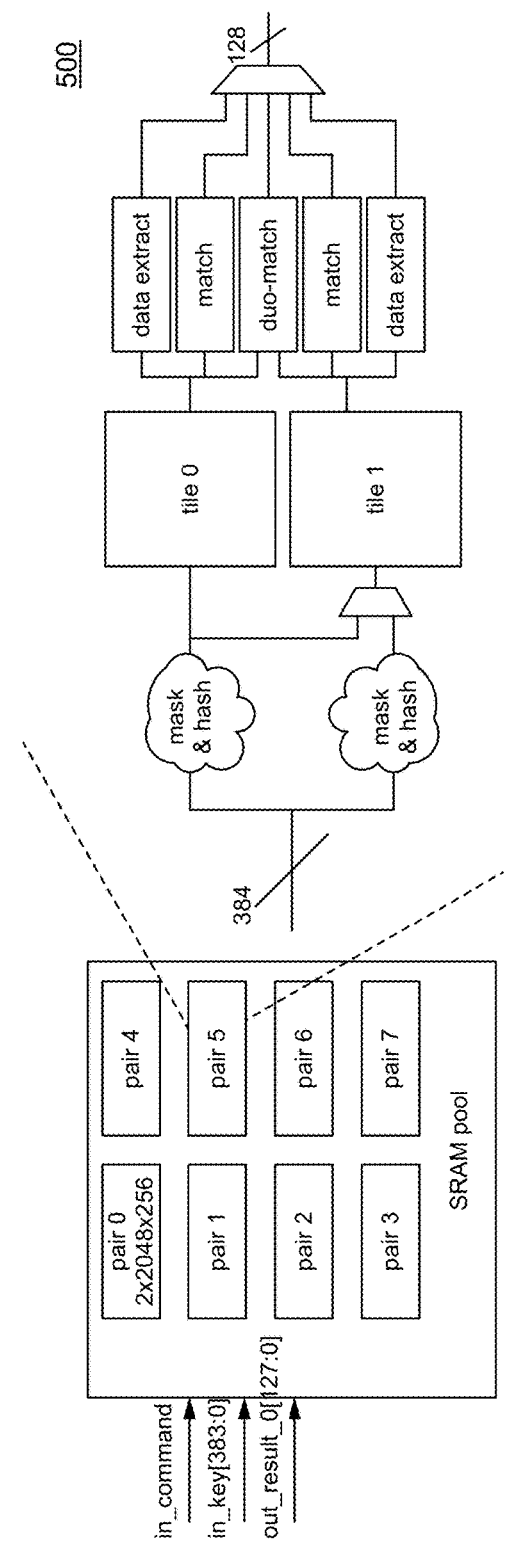
FIG. 5 illustrates an exemplary diagram of a SRAM pool in accordance with some embodiments.

FIG. 5 illustrates an exemplary diagram of a SRAM pool 500 in accordance with some embodiments. In some embodiments, each of the SRAM pools 310 of FIG. 3 is similarly configured as the SRAM pool 500. The SRAM pool 500 includes multiple SRAM tiles. For example, the SRAM pool 500 includes 16 SRAM tiles. These multiple physical memory tiles can be logically organized to represent a different logic table width. In some embodiments, two physical memory tiles are grouped to store one set of logic data. As such, the SRAM pool 500 includes eight pairs of SRAM tiles. The mechanism for the pairing will become more evident as entry insertions and table lookups are discussed. In some embodiments, the logical organization of these multiple SRAM tiles is reconfigurable. In some embodiments, every SRAM tile is 256-bits wide and 2048-lines deep, although other sizes are possible.

Data in the SRAM are stored as separate logical entries in the SRAM. Entries could be of different width based on application. In some embodiments, a logical entry could be 256-bits wide, where every row of a SRAM tile is an entry. A logical entry could also be 512-bits wide, in which case, one row of a SRAM tile (256-bits wide) is concatenated with a row of the other SRAM tile (256-bits wide) in the corresponding pair to be 512-bits wide. As further discussed below, each entry in a SRAM tile stores a pattern.

Assume the SRAM pool 500 is an active pool, which would be indicated as such by the sram_pool_bitmap field in the hybrid WCM table. Once a key arrives at each of the pairs of tiles in the SRAM pool 500, a corresponding hash function is applied to the key. The hash function maps the key to a narrower index or address, which is used to address the SRAM tiles to retrieve an entry. In some embodiments, if a table entry (pattern) is 256-bits wide, then the entire entry is stored in one SRAM line (e.g., each tile is one way). In some embodiments, if a table entry is 512-bits wide, then the entire entry spans across the two SRAM tiles (e.g., every two tiles consist of one way). This is regardless of the input key width. As such, when a search key is forwarded to the SRAM pool 500, each way applies a hash mask and hash function to the search key to look up the entry. It should be noted that the hash mask is also able to be referred to as a "key map" or "way mask."

In some embodiments, the SRAM pool 500 can do a maximum 16-way hash for narrow entries. In some embodiments, for hardware cost purposes, control data is stored in two pairs of SRAM tiles and entries are stored in six pairs of SRAM tiles. As such, in these embodiments, the SRAM pool 500 is limited to a 12-way hash for a key of 256-bits or less and to a 6-way hash for a key of 512-bits or less.

Table 2 lists exemplary entry formats of the SRAM entry table. The SRAM entry table shows support for three different key sizes or formats: 128-bit key, 192-bit key and 384-bit key. The 128-bit key can fit in one of two types of 256-bit entries. The 192-bit key fits in a 512-bit entry. The 384-bit key entry fits in a 512-bit entry.

TABLE 2

| | Width | Field | Description |
|---|---|---|---|
| 128-bit key (256-bit entry) | 12 | priority | In case of multiple matches, select final match based on priority |
| | 205 | pattern | Encoded pattern, 0, 1 or X (don't care) |
| | 6 | dbyte_sel_{0, 1} | Select up to two 16-bit field as range specification. Value represented in the pattern field is used as lower bound. |
| | 32 | dbyte_up_bound_{0, 1} | |
| | 1 | dbyte_range_concat | If set, combine both 16-bit fields for one 32-bit comparison |
| 128-bit key (256-bit key) | 20 | priority | In case of multiple matches, select final match based on priority |
| | 128 | value | |
| | 16 | byte_mask | If a bit is 0, a corresponding byte of the value field is "don't care" |
| | 12 | dbyte_sel_{0 . . . 3} | Select up to four 16-bit fields as range specification |
| | 64 | dbyte_up_bound_{0 . . . 3} | |
| | 3 | dbyte_range_concat | If bit i is set, combine field i and i + 1 for 32-bit comparison |
| | 13 | reserved | |

TABLE 2-continued

| | Width | Field | Description |
|---|---|---|---|
| 192-bit key (512-bit entry) | 19 | priority | In case of multiple matches, select final match based on priority |
| | 192 | value | |
| | 192 | bit_mask | If a bit is 0, a corresponding bit of the value field is "don't care" |
| | 25 | dbyte_sel_{0 . . . 4} | Select up to five 16-bit fields as range specification |
| | 80 | dbyte_up_bound_{0 . . . 4} | |
| | 4 | dbyte_range_concat | If bit i is set, combine field i and i + 1 for 32-bit comparison |
| 384-bit key (512-bit entry) | 15 | priority | In case of multiple matches, select final match based on priority |
| | 384 | value | |
| | 48 | byte_mask | If a bit is 0, a corresponding byte of the value field is "don't care" |
| | 15 | dbyte_sel_{0, 1, 2} | Select up to three 16-bit fields as range specification |
| | 48 | dbyte_up_bound_{0, 1, 2} | |
| | 2 | dbyte_range_concat | If bit i is set, combine field i and i + 1 for 32-bit comparison |

As shown in the SRAM entry table, an explicit priority is provided for each entry. As noted above, priority is implicit within TCAM based on the location of the entry. In the hybrid SRAM and TCAM scheme, each TCAM entry also requires explicit priority to be arbitrated with potential SRAM entry matches. Priority must be specified in the SRAM entry table since priority is decoupled from the addressing itself. The pattern of the entry is encoded. The SRAM entry table also provides a range specification and whether concatenation is set for each entry. The SRAM entry table provides that, for some formats, a mask that indicates which byte(s) or bit(s) of the value field is a "don't care" or wildcard. In some embodiments, the SRAM entry table is either automatically updated or manually updated via software.

To represent a N-bit pattern with wildcards as a binary value requires N×log$_2$3 or 1.6N bits. For example, a 5-bit pattern with wildcards is an 8-bit binary. Three coefficient values are used to represent a 0 value, a 1 value and a wildcard. In particular, the coefficient value of 0 indicates a 0 value, the coefficient value of 1 indicates a 1 value, and the coefficient value of 2 indicates a wildcard. For example, the encoded 5-bit pattern 5'b01XXX, with X being the wildcard, is an 8-bit binary value of 8'd53, which is equivalent to 8'h35. Specifically, the 8-bit binary value is the total of 2×3$^0$ (for the 0$^{th}$ bit in the 5-bit pattern), 2×3$^1$ (for the 1$^{st}$ bit in the 5-bit pattern), 2×3$^2$ (for the 2$^{nd}$ bit in the 5-bit pattern), 1×3$^3$ (for the 3$^{rd}$ bit in the 5-bit pattern), and 0×3$^4$ (for the 4$^{th}$ bit in the 5-bit pattern).

The decoded 8-bit binary value 8'd53 is a 5-bit pattern of 5'b01XXX. Specifically, the coefficient values for the bits of the 5-bit pattern are: (53/3$^0$)%3=2 (or X for the 0$^{th}$ bit in the 5-bit pattern), (53/3$^1$)%3=2 (or X for the 1$^{st}$ bit in the 5-bit pattern), (53/3$^2$)%3=2 (or X for the 2$^{nd}$ bit in the 5-bit pattern), (53/3$^3$)%3=1 (or 1 for the 3$^{rd}$ bit in the 5-bit pattern), and (53/3$^4$)%3=0 (or 0 for the 4$^{th}$ bit in the 5-bit pattern). These calculations use integer division.

Referring back to Table 2, it should be noted that for a 16-bit or 32-bit range specification, if a value contains an X (e.g., "don't care" or wildcard), then the corresponding dbyte_up_bound field is not valid. Similarly, if a dbyte_up_bound is less than the corresponding value, then the dbyte_up_bound field is not valid.

Entries are each inserted as a pattern into the SRAM pools and the TCAM pool. In some embodiments, the entries are software configured into the pools. Referring back to Table 1, each SRAM way (SRAM tile or pair, depending on entry width) is associated with a key_map, which indicates whether that SRAM way is hashable for an entry to be inserted. The key_map masks bits of the entry that participate in the hash function. If a SRAM way is hashable, then the entry is inserted into that SRAM way where any x-bit of the pattern is masked off from hashing. For example, a 128-bit entry of {128.\*.\*.\*, 162.192.\*.\*, 16'd456, 16'd31002, 8'h6, 24'h0} is to be inserted.

Assume the key_map of a SRAM is 32'hC0C0_00FF. Based on this assumption, this SRAM way is hashable for the 128-bit entry. In particular, every bit in the key_map masks corresponding four bits from the entry (key). The value C in hexadecimal is 1100 in binary and the value 0 in hexadecimal is 0000 in binary. This means the upper eight bits in the pattern participate in hashing, the next 24 bits do not participate in hashing, the next 8 bits participate in hashing, the next 56 bits do not participate in hashing, and the last 32 bits participate in hashing. In this case, since all the bits in the entry that participate in hashing are exact numbers, this SRAM way is hashable.

However, assume the key_map of a SRAM way is 32'hF0C0_00FF. Based on this assumption, this SRAM way is not hashable for the 128-bit entry. The value F in hexadecimal is 1111 in binary. This means the upper 16 bits in the pattern participate in hashing, the next 16 bits do not participate in hashing, the next 8 bits participate in hashing, the next 56 bits do not participate in hashing, and the last 32 bits participate in hashing. In this case, since all upper 16 bits need to participate in hashing but only the first 8 bits of the 16 bits are exact numbers and the remaining eight bits are wildcards, this SRAM way is not hashable.

If no SRAM ways are hashable, then the entry is either inserted into the spillover TCAM or, alternatively, each bit of x can be expanded into a plurality of patterns such that they are hashable. Continuing with the last assumption, since eight bits are missing for hashing, the pattern can be expanded into 2$^8$ or 256 different patterns, each corresponding to 256 individual numbers. As such, all these different patterns become hashable.

Figure 6:
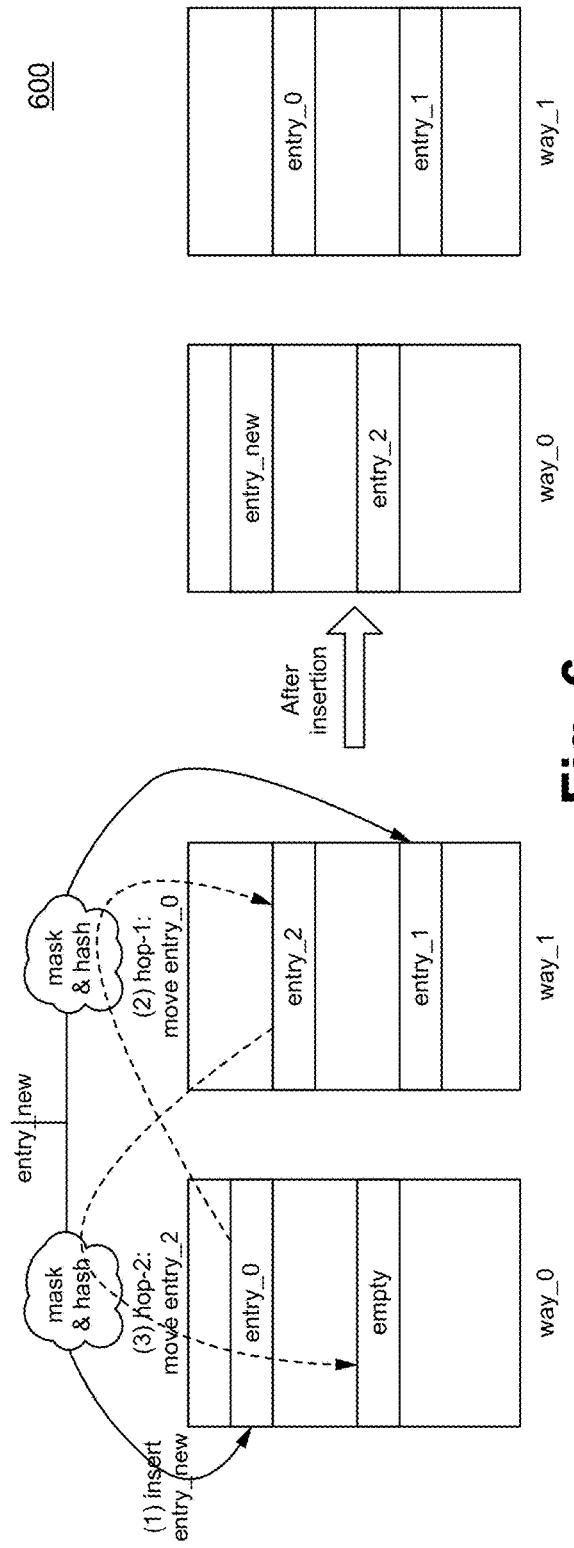
FIG. 6 illustrates an exemplary scenario of rehashing to resolve a hash conflict in accordance with some embodiments.

FIG. 6 illustrates an exemplary scenario 600 of rehashing to resolve a hash conflict in accordance with some embodiments. In some embodiments, rehashing is carried out using ways and hops. The scenario 600 depicts a 2-way hash. Once a new entry or a pattern comes in, the entry is masked and hashed for each way. Each mask and hash unit points to a location in its corresponding SRAM tile, as illustrated by the black dotted lines in FIG. 6. If one or both locations are empty, then the pattern is inserted in one of the locations. In some embodiments, if both locations are empty, then preference of insertion is given to the lower way (e.g., way_0), which is typically associated with the lowered number SRAM tile.

A hash conflict occurs when one or both locations are occupied, such as in scenario 600. In FIG. 6, the locations pointed by the mask and hash units are occupied by "entry 0" and "entry 1." In a hash conflict, entries are "kicked out" of their locations to different locations until a location is empty. In some embodiments, when both locations are occupied, the new entry is always inserted via the lower way (e.g., way_0) or arbitrarily inserted via one of the ways. In FIG. 6, the new entry is inserted via way_0 at the location of "entry 0." Assuming both ways are hashable for "entry 0," "entry 0" is rehashed via the other way (e.g., way_1). "Entry 0" is inserted in a location that is occupied by "entry 2." The insertion of "entry 0" in its new location is referred to as hop-1. Further assuming both ways are hashable for "entry 2," "entry 2" is rehashed via the other way (e.g., way_0). "Entry 2" is inserted in a location that is unoccupied. The insertion of "entry 2" in its new location is referred to hop-2. In this scenario, the hash conflict is resolved using two hops. However, in other scenarios, a hash conflict is resolved using more than two hops.

The rehash can implement a depth-first insertion algorithm (depth of all tiles), such as illustrated in FIG. 6. Alternatively, the rehash can implement a breadth-first insertion algorithm (width of each tile). Alternatively, the rehash can be based on D-left hashing. If a hash conflict cannot be resolved through rehashing, then the corresponding entry is inserted into one of the at least one spillover TCAM pools.

Figure 7:
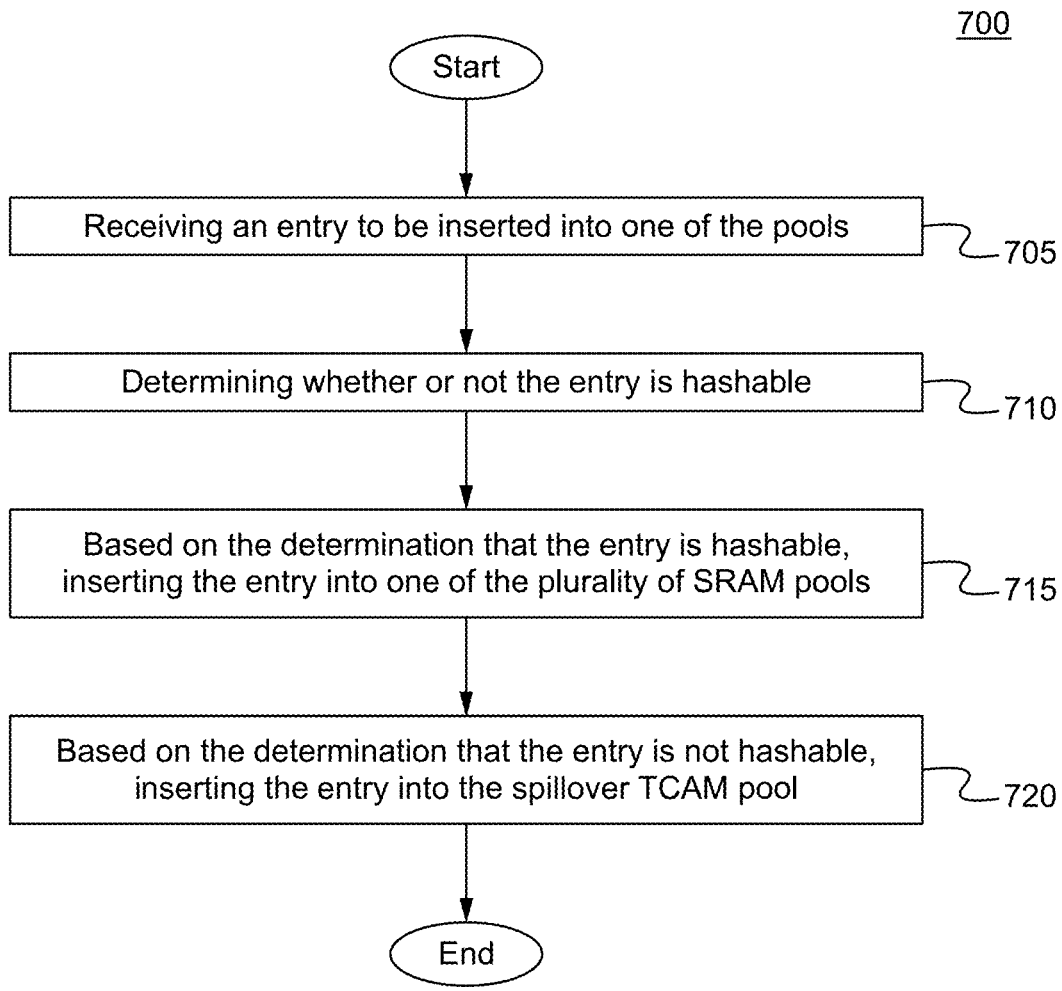
FIG. 7 illustrates a method of entry insertion in accordance with some embodiments.

FIG. 7 illustrates a method of entry insertion 700 in accordance with some embodiments. The method of entry insertion 700 is typically implemented on a network switch that includes a plurality of SRAM pools and at least one spillover TCAM pool. At a step 705, an entry to be inserted into one of the pools is received. At a step 710, it is determined whether the entry is hashable. In some embodiments, the determination at the step 710 includes comparing each key_map with the entry. As discussed above, each of the plurality of SRAM pools includes 16 SRAM tiles. Each of the 16 SRAM tiles is associated with a key_map. Each key_map masks bits of the entry that participate in hashing. The entry is hashable when all bits in the entry that participate in hashing are exact numbers. At a step 715, based on the determination that the entry is hashable, the entry is inserted into one of the plurality of SRAM pools. In some embodiments, the entry is inserted into one of two SRAM tiles of the one of the plurality of SRAM pools. In some embodiments, inserting the entry into one of the plurality of SRAM pools includes rehashing to resolve a hash conflict. The rehashing can implement a depth-first insertion algorithm or a width-first insertion algorithm. At a step 720, based on the determination that the entry is not hashable, the entry is inserted into the spillover TCAM pool. The entry is inserted as a pattern into one of the pools.

Figure 8:
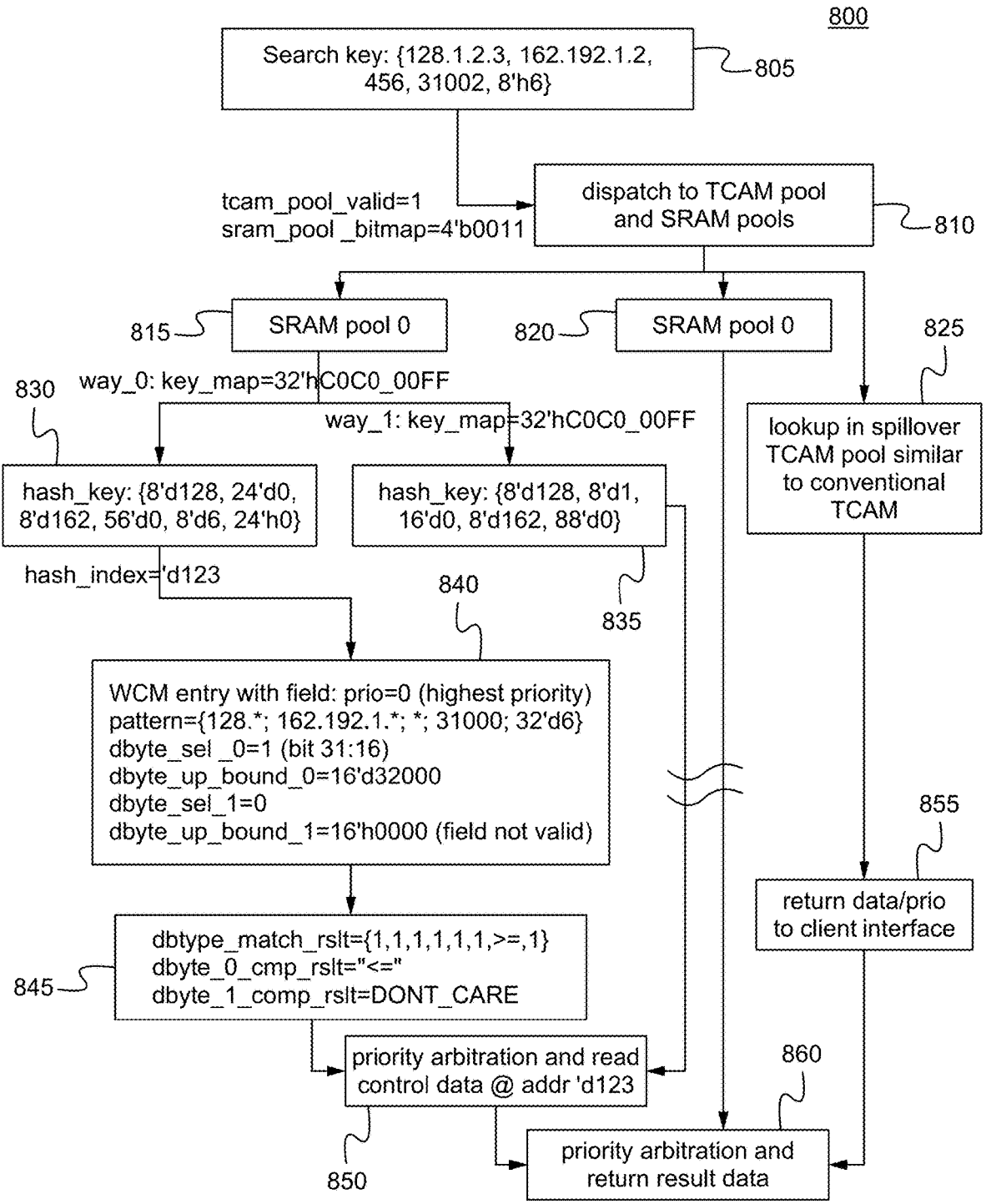
FIG. 8 illustrates an exemplary flow of table lookup in accordance with some embodiments.

Now assume that after the 128-bit entry of {128.*.*.*, 162.192.*.*, 16'd456, 16'd31002, 8'h6, 24'h0} has been inserted into SRAM pool 0, FIG. 8 illustrates an exemplary flow of table lookup 800 in accordance with some embodiments. At a step 805, a search key of {128.1.2.3, 1.62.192.1.2, 456, 31002, 8'h6} arrives at the request interface control logic 305 of FIG. 3.

At a step 810, the request interface control logic 305, based on the configurations in the hybrid WCM table, dispatches accordingly the search key to active pools. In this example, team_pool_valid is set to 1 and the sram_pool_bitmap is 4'b0011, which corresponds to SRAM pool 0 and SRAM pool 1. As such, the spillover TCAM pool, SRAM pool 0 and SRAM pool 1 are active pools.

At a step 815, the search key is received at SRAM pool 0. At a step 820, the search key is received at SRAM pool 1. At a step 825, the search key is received at the spillover TCAM. The steps 815-825 occur substantially simultaneously. Generally, the lookup steps in FIG. 9 occur simultaneously or in parallel.

At the step 825, lookup in the spillover TCAM is similar to conventional TCAM. At a step 855, the spillover TCAM returns the control data and priority to the request interface control logic 305.

SRAM pool 0 corresponds to a 2-way hash. Each of the ways is associated with a key_map, which is applied to mask off the corresponding bits of the search (input) key. In FIG. 8, way_0 has the key_map 32'hC0C0_00FF and way_1 has the key_map 32'hF0C0_00FF. The key_map of way_0 and the search key are applied to a hash function, which returns a hash_key of {8'd128, 24'd0, 8'd162, 56'd0, 8'd6, 24'h0} at a step 830. Similarly, the key_map of way_1 and the search key are applied to the hash function, which returns a hash_key of {8'd128, 8'dl, 16'd0, 8'd162, 88'd0} at a step 835.

The hash_key at the step 830 corresponds to the hash_index 'd123, which points to a particular entry in the SRAM tiles of SRAM pool 0 at a step 840. The entry is compared with the search key and the result is returned at a step 845.

The results from the SRAM pools 0 and 1 are returned at a step 850, in which priority arbitration is performed and control data is thereafter read from the corresponding entry that has the highest priority and that is located in the remaining SRAM tiles. In this example, nothing is returned by SRAM pool 0, way 1 and the control data is read at address 'd123 since the corresponding entry has the highest priority.

The results from the step 850 and the step 855 are returned at a step 860, in which priority arbitration is performed and the results data is returned. In this example, no data is returned by SRAM pool 1.

Figure 9:
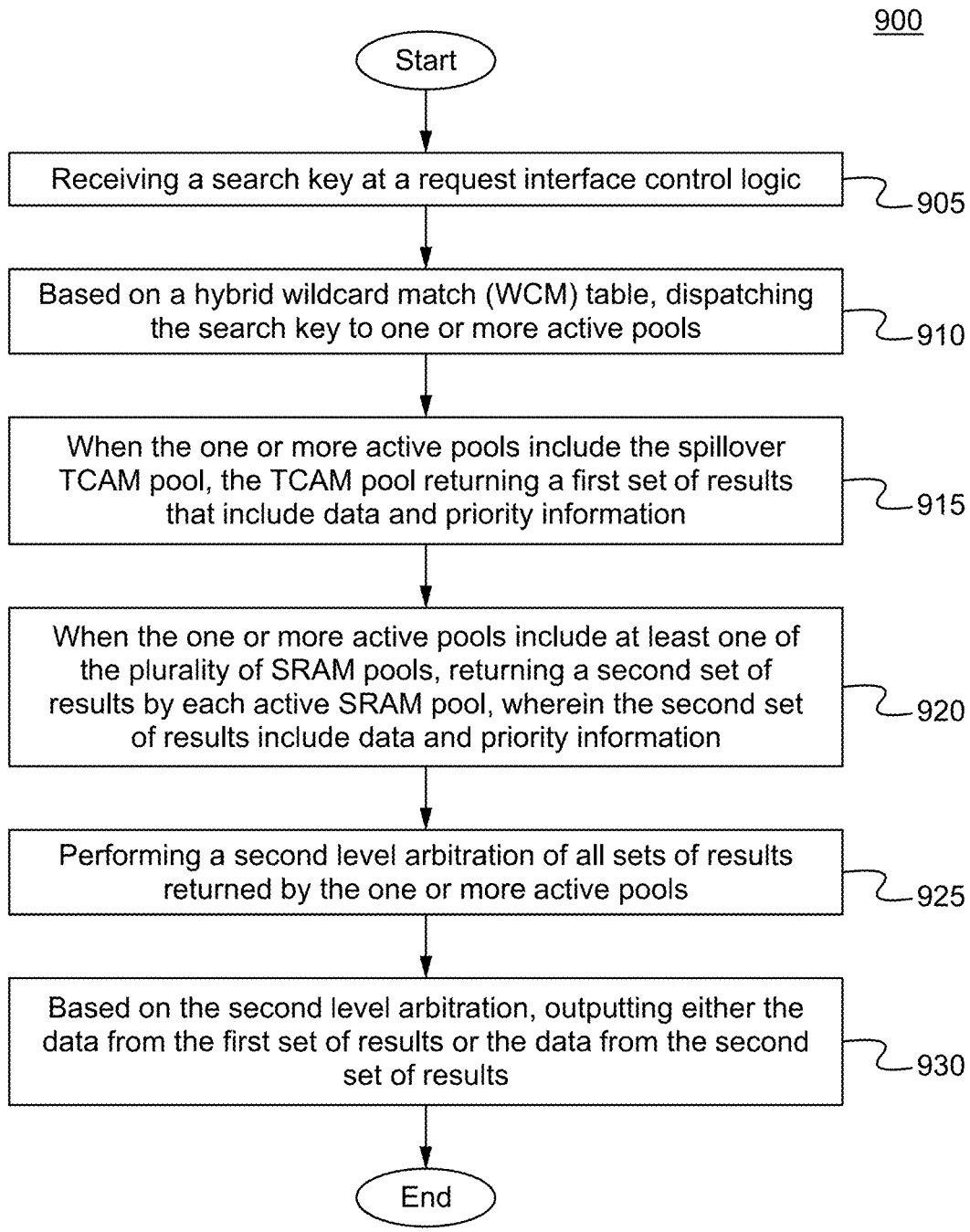
FIG. 9 illustrates a method of table lookup in accordance with some embodiments.

FIG. 9 illustrates a method of table lookup 900 in accordance with some embodiments. The method of table lookup 900 is typically implemented on a network switch that includes a plurality of SRAM pools and at least one spillover TCAM pool. At a step 905, a search key is received at a request interface control logic. The network switch typically includes the request interface control logic. At a step 910, based on a hybrid wildcard match (WCM) table, the search key is dispatched to one or more active pools. Configurations of the hybrid WCM table indicate which of the pools are the one or more active pools. In some embodiments, lookups in the one or more active pools are performed simultaneously. At a step 915, when the one or more active pools include the spillover TCAM pool, the TCAM pool returns a first set of results that includes data and priority information. At a step 920, when the one or more active pools include at least one of the plurality of SRAM pools, each active SRAM pool returns a second set of results that includes data and priority information. For each active SRAM pool, to determine the second set of results, a first level arbitration based on priority is performed for all sets of results returned by each SRAM tile of a corresponding active SRAM pool. At a step 925, a second level arbitration based on priority is performed for all sets of results returned by the one or more active pools. At a step 930, based on the second level arbitration, data from the set with the highest priority is outputted.

FIG. 10A illustrates formats of entries 1000, 1000', 1000" of an SRAM entry table according to some embodiments. The SRAM table is able to be substantially similar to the SRAM table described above except for the differences described herein. Additionally, as described above, each of the entries 1000, 1000', 1000" correspond to a 5-dimensional packet matching rule 100. As shown in FIG. 10A, the different entry formats 1000, 1000', 1000" are able to support three different key/entry sizes. A 128 bit format entry 1000 (for a 128 bit key) has16 bytes dedicated to a value or pattern field 1002, 15 bytes dedicated to a code field 1004 and 1 byte dedicated to a priority/combination field 1006. In some embodiments, the entry 1000 is able to be stored in a single line of the memory. A 384 bit format entry 1000' (for a 192 bit key) has 24 bytes dedicated to a value or pattern field 1002, 8 bytes dedicated to other data 1003 (e.g. this field is able to be used to store control data that is returned upon a hit on this field), 15 bytes dedicated to a code field 1004 and 1 byte dedicated to a priority/combination field 1006. A 512 bit format entry 1000" (for a 384 bit key) has 48 bytes dedicated to a value or pattern field 1002 that starts with the most significant bits (MSB) of the value data in a first line 1005 of the memory (e.g. SRAM) and the least significant bits (LSB) of the value data in a second line 1005 of the memory (e.g. SRAM), 15 bytes dedicated to a code field 1004 and 1 byte dedicated to a priority/combination field 1006. Alternatively, one or more of the fields are able to be larger or smaller and/or be located in the same or different lines of the memory.

The value field 1002 stores the values that are matched or compared to the values of a key (e.g. 128 byte key) according to the codes 1004a-b (see FIG. 10B) of the code field 1004 in order to determine if the key matches the entry 1000, 1000', 1000". In some embodiments, the field data and/or the data field 1002 is able to be non-contiguous within the entry 1000, 1000', 1000" (e.g. within the lines of the memory storing the entry). For example, one or more of the values of the value field 1002 are able to be located adjacent to or at an end of one or more of the codes 1004a-d (e.g. match/no match codes) within the entry (e.g. the SRAM lines of the entry) separate from the remainder of the field data and/or the data field 1002 within the entry.

The priority/combination data field 1006 is able to include combination data (e.g. a combination vector or logic tree) that indicates what combination of results/outcomes from the application of the codes 1004a-d of the entry 1000, 1000', 1000" to the key indicate a match between the key and the entry 1000, 1000', 1000". For example, the combination data is able to indicate that the outcome of three of the codes 1004a-d need to be a 1 (e.g. satisfy the code) and the remaining codes 1004a-d need to be a zero (e.g. do not satisfy the code) in order for the key to match the entry 1000, 1000', 1000". Additionally, the priority/combination data field 1006 is able to include priority data that indicates a priority of an output result when there is a match between the key and entry/rule (e.g. according to the codes and combination data). Specifically, when multiple results are received from one or more SRAM pools 310 and/or one or more TCAM pools 315, the priority data of the priority field for each of the pools 310, 315 are compared by the second level arbitration logic in order to arbitrate between the results as described in steps 850-860 above. Indeed, this explicitly assigned priority is in contrast to TCAM priority which merely selects the match that is stored in the earliest entry within the TCAM.

The code field 1004 is able to comprise one or more 2 byte and/or 3 byte codes 1004a-d that fit within the size of the field 1004 and define in what ways the selected data of the key must correspond to the selected value data of the value field 1002 in order to satisfy or not satisfy the rule 100. Thus, for a code field 1104 of 15 bytes, a maximum of seven 2 byte match codes 1004a, b, equaling 14 bytes, or five 3 byte codes 1004c, d, equaling 15 bytes, or a combination of 2 and 3 byte codes 1004a-d totaling less than 15 bytes are able to be used for each entry 1000, 1000', 1000".

FIG. 10B illustrates four different types of codes 1004a-d that are able to be used for implementing an entry 1000, 1000', 1000" according to some embodiments. As shown in FIG. 10B, the code 1004a is an exact (or equal) match code that indicates to check whether a key value (at a designated portion of the key) exactly matches a value (at a designated portion of the value field 1002) of the entry 1000, 1000', 1000" and the code 1004b is an no exact match code that indicate to check whether a key value (at a designated portion of the key) does not exactly match a value (at a designated portion of the value field 1002) of the entry 1000, 1000', 1000". As also shown in FIG. 10B, the code 1004c is an in range code that indicates to check whether a key value (at a designated portion of the key) falls within a specified range and the code 1004d is an out of range (or not in range) code that indicates to check whether a key value (at a designated portion of the key) falls outside a specified range. As described above, in some embodiments the match/no match codes 1004a, b are 2 bytes and the within range/not within range codes 1004c, d are 3 bytes. Alternatively, one or more of the code types 1004a-d are able to be smaller or larger in size.

Each of the exact match codes 1004a and the exact no match codes 1004b is able to comprise a two bit code type identifier field 1010 that identifies the code 1004a, b as either exact match or exact no match; a seven bit nibble index field 1012 that identifies the starting location of the desired match/no match data within the key (e.g. the subkey) and the starting location of the desired match/no match data within the value field 1002 of the entry 1000, 1000', 1000"; and a seven bit length field 1014 that identifies the length/number of bits after the starting location (indicated by the nibble index 1012) to select such that the selected data represents all the value field data and all key data to be used in the match/no match code 1004a, b determination. Additionally, in some embodiments if the number of bits of the bit length field 1014 is equal to zero, the bit length field 1014 for that code 1004a, b is able to be changed to a single bounded range value. Specifically, if the code was an exact match code 1004a, the code determines if the selected key value (e.g. subkey) is larger than or equal to the single bounded range value within the bit length field 1014. Similarly, if the code was an exact no match code 1004b, the code determines if the selected key value (e.g. subkey) is less than the single bounded range value within the bit length field 1014.

Each of the in-range/out-of-range codes 1004c, d is able to comprise a two bit code type identifier field 1010 that identifies the code as either in-range 1004c or out-of-range 1004d; a six bit byte index field 1016 that identifies the starting location of the desired data within the key (e.g. a 16 bit subkey or other predetermined range subkey length) and the starting location of the lower bound value within the value field 1002 of the entry 1000, 1000', 1000"; and a 2 byte upper bound field 1018 that indicates the upper bound of the range code 1004c, d. If the code is an in-range code 1004c, the upper and lower bound values are inclusive and if the code is an out-of-range code 1004d, the upper and lower bound values are exclusive. Thus, the in-range/out of range codes 1004c, d enable it to be determined if the subkey value is between or not between the lower and upper bounds (i.e. the range). Alternatively, different allocations of bits of each of the codes 1004a-d for one or more of the various fields of the codes 1004a-d are contemplated. Additionally, in some embodiments one or more of the codes 10004a-d of one or more of the entries 1000, 1000', 1000" are able to not be byte aligned within the entry 1000, 1000', 1000".

In some embodiments, out-of-range or in-range codes for larger size bit ranges are able to be created by logically combining smaller bit out-of-range codes, in-range codes and/or match codes. As a result, a in/out-of-range comparison code for a larger bit range (e.g. 32 bits, 48 bits) is able to be accomplished in rule/entry 1000, 1000', 1000" using multiple smaller/standard bit in/out-of-range comparison codes (e.g. 16 bit) such that the entry effectively comprises the larger size bit range code (that is represented by the combination of the smaller bit size codes). In such embodiments, the combination data is able to implement/indicate the desired logical combination of the standard bit range codes 1004a-d that is required for causing the combination of those codes to "equal" or effectively generate a one or more out-of-range or in-range codes for larger size bit ranges. For example, an entry 1000, 1000', 1000" whose range codes 1004c, d are limited to 16 bits, is able to implement a 32 bit in-range or out-of-range code by including multiple 16 bit range codes and one or more exact match codes that when logically combined (as indicated in the combination data) have the same results as would the desired 32 bit in-range or out-of-range code. Or to put it logically, in order to determine if a key value K is within a 32 bit range that has a lower boundary L and an upper boundary U (e.g. is L≤K≤U?), the 32 bit value K is treated as composed of two 16-bit portions L0 to U0 and L1 to U1 (where L0≤U0≤L1≤U1). As a result, L≤K≤U becomes L1L0≤K1K0≤U1U0, which can be then broken down into a logical combination of two 16 bit exact match codes 1004a and three 16 bit in-range codes 1004c:((L1+1≤K1≤U1) OR (L1==K1 && L0≤K0≤0xFFFF) OR (U1==K1 && 0x0≤K0≤U0))=L1L0≤K1K0≤U1U0. Thus, the logical combination of the two 16 bit exact match codes 1004a and three 16 bit in-range codes 1004c is able to effectively create a 32 bit in-range code for use by the entry 1000, 1000', 1000".

Figure 11:
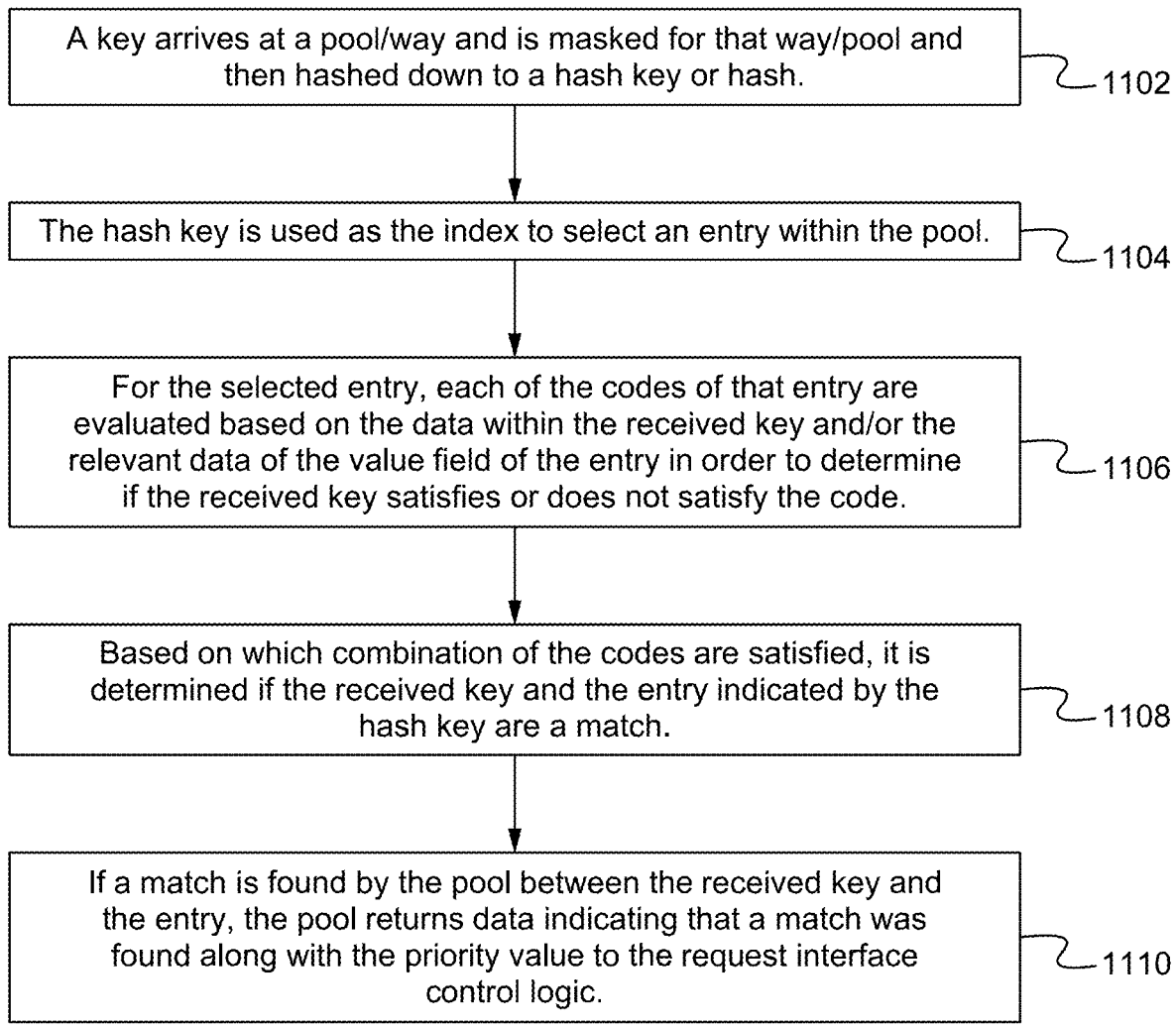
FIG. 11 illustrates a method of determining if a received key and a determined entry result in a match for a way of a pool according to some embodiments.

FIG. 11 illustrates a method of determining if a received key and a determined entry 1000, 1000', 1000" result in a match for a way (e.g. way_0) of a pool (e.g. SRAM pool 0) according to some embodiments. In particular, the method is able to supplement and/or replace steps 815, 830, 840, 845 and 850 in the method described in FIG. 8 above such that the method is able to be combined with the method of FIG. 8 to form a combined method. As shown in FIG. 11, a key arrives (e.g. 128 bytes) at a pool/way and is masked for that way/pool and then hashed down to a hash key or hash (e.g. 11 bits) at the step 1102. The hash key is then used as the index to select an entry 1000, 1000', 1000" within the pool at the step 1104. For the selected entry 1000, 1000', 1000", each of the codes 1004a-d of that entry are evaluated based on the data within the received key and/or the relevant data of the value field 1002 of the entry in order to determine if (the data of) the received key satisfies or does not satisfy the code 1004a-d (e.g. is an exact match, is not an exact match, is within the range, is not within the range) at the step 1106. In some embodiments, the index starts from the most significant bit of the codes 1004a-d of the selected entry 1000, 1000', 1000". Based on which combination of the codes 1004a-d is determined to be satisfied, it is determined if the received key and the entry indicated by the hash key are a match at the step 1108.

In some embodiments, the combination data (e.g. combination vector or logic tree of the priority/combination field 1006 of the selected entry 1000, 1000', 1000" indicates what combination of satisfying/not satisfying the codes 1004a-d of the selected entry indicate a match between the key and the entry. For example, if the entry comprises 3 codes (e.g. exact match, in-range, out-of-range), the combination data is able to indicate that for a key to match the entry 1000, 1000', 1000" the first two codes must be satisfied and the third code must not be satisfied. In other words, for each code, the combination data is able to indicate what result of evaluating the code for the received key is desired such that if all of the desired results are found the key matches the entry. If a match is found by the pool 310, 315 between the received key and the entry 1000, 1000', 1000", the pool/way 310, 315 returns data indicating that a match was found (e.g. a match bit) along with the priority value (of the priority/combination field 1006 of the selected entry) to the request interface control logic 305 to be arbitrated among results from other pools 310, 315 at the step 1110. Thus, the entry format and evaluation method provides the advantage of enabling processing power and storage area to be saved by using an SRAM pools and TCAM pools hybrid instead of just TCAMs. Indeed, this also beneficially enables priority of each entry to be selectively specified, whereas in TCAMs priority is just according to the position of the entry within the TCAM.

One of the key ideas of the wildcard matching solution is that most entries are inserted into the plurality of SRAM pools. The SRAM pools may not perform matching on tough patterns, in which case the spillover TCAM pool will perform the matching on these tough patterns. Depending on whether there is a high level software algorithm support, the hardware can be decoupled from the software algorithm. If the software algorithm is confident in performing the matching, very little TCAM resources are used. On the other hand, if the software algorithm is not confident or is lazy in performing the matching, more TCAM resources can be used.

One of ordinary skill in the art will realize other uses and advantages also exist. While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

We claim:

1. A network switch comprising:
   a static random access memory (SRAM) entry table including a plurality of entries, wherein each of the entries comprise:
   a code field including one or more codes; and
   a value field including rule comparison data; and
   one or more SRAM pools;
   at least one spillover ternary content addressable memory (TCAM) pool; and
   a non-transitory computer readable medium storing request interface control logic dispatching a search key to one or more of the SRAM pools and the at least one spillover TCAM pool and determining if the search key is a match for one or more of the entries based on which of the codes are satisfied by the search key and which of the codes are not satisfied by the search key.

2. The network switch of claim 1, wherein each of the codes occupies either 2 bytes or 3 bytes of the code field.

3. The network switch of claim 2, wherein at least one of the codes is an equal-match type code or a not-equal-match type code, the at least one of the codes comprising:
an identifier that distinguishes the at least one of the codes from other types of the codes;
a nibble index that identifies a location of match data to compare within both the search key and the value field; and
a bit length that indicates a number of bits after the location within both the search key and the value field to compare as the data, wherein the at least one of the codes relates to determining if the match data of the search key is the same as the match data from the value field.

4. The network switch of claim 3, wherein at least another one of the codes is an in-range type code or a not-in-range type code, the at least another one of the codes comprising:
an identifier that distinguishes the at least another one of the codes from the other types of the codes;
a byte index that identifies a location of data relating to a lower boundary of the at least another one of the codes within the value field and a location of target data within the search key; and
an upper boundary field that includes data relating to an upper boundary of the at least another one of the codes, wherein the at least another one of the codes relates to determining if the target data is within or outside of the upper boundary and the lower boundary.

5. The network of claim 4, wherein the at least one of the codes occupies 2 bytes of the code field and the at least another one of the codes occupies 3 bytes of the code field.

6. The network of claim 5, wherein a priority field of each of the entries comprises combination data that indicates what combination of results of evaluating each of the codes of the rule with respect to the search key qualify as the search key matching the entry.

7. The network of claim 6, wherein each of the at least another one of the codes is limited to a predetermined maximum bit size range that is less than a desired bit size range, and further wherein the combination data is based on an in-range type code for the desired bit size range or an out-of-range type code for the desired bit size such that the combination data indicates a logical combination of a plurality of the codes of the entry that when evaluated results in output that is equivalent to the in-range type code for the desired bit size range or the out-of-range type code for the desired bit size.

8. The network switch of claim 7, wherein a hybrid wildcard match (WCM) table is accessible by the SRAM pools, the at least one spillover TCAM pool, and the request interface control logic.

9. The network switch of claim 8, wherein the hybrid WCM includes configurations for the SRAM pools, the at least one spillover TCAM pool, and the request interface control logic.

10. The network switch of claim 9, wherein the configurations identify which of the SRAM pools and the at least one spillover TCAM pool are active pools.

11. The network switch of claim 10, wherein arbitration takes place to determine which of the one or more active pools has priority to return the results data.

12. A method of implementing a network switch that includes one or more static random access memory (SRAM) pools and at least one spillover ternary content addressable memory (TCAM) pool, the method comprising:
with the network switch:
identifying an entry;
if the entry is hashable, inserting the entry into one of the SRAM pools, wherein the entry as inserted into the one of the SRAM pools comprises:
a code field including one or more codes; and
a value field including rule comparison data; and
if the entry is not hashable, inserting the entry into the at least one spillover TCAM pool, wherein a match between at least a portion of a search key and at least a portion of the rule comparison data is based on which of the codes are satisfied by the portion of the search key and which of the codes are not satisfied by the portion of the search key.

13. The method of claim 12, wherein each of the codes occupies either 2 bytes or 3 bytes of the code field.

14. The method of claim 13, wherein at least one of the codes is an equal-match type code or a not-equal-match type code, the at least one of the codes comprising:
an identifier that distinguishes the at least one of the codes from other types of the codes;
a nibble index that identifies a location of match data to compare within both the search key and the value field; and
a bit length that indicates a number of bits after the location within both the search key and the value field to compare as the data, wherein the at least one of the codes relates to determining if the match data of the search key is the same as the match data from the value field.

15. The method of claim 14, wherein at least another one of the codes is an in-range type code or a not-in-range type code, the at least another one of the codes comprising:
an identifier that distinguishes the at least another one of the codes from the other types of the codes;
a byte index that identifies a location of data relating to a lower boundary of the at least another one of the codes within the value field and a location of target data within the search key; and
an upper boundary field that includes data relating to an upper boundary of the at least another one of the codes, wherein the at least another one of the codes relates to determining if the target data is within or outside of the upper boundary and the lower boundary.

16. The method of claim 15, wherein the at least one of the codes occupies 2 bytes of the code field and the at least another one of the codes occupies 3 bytes of the code field.

17. The method of claim 16, wherein a priority field of each of the entries comprises combination data that indicates what combination of results of evaluating each of the codes of the rule with respect to the search key qualify as the search key matching the entry.

18. The method of claim 17, wherein each of the at least another one of the codes is limited to a predetermined maximum bit size range that is less than a desired bit size range, and further wherein the combination data is based on an in-range type code for the desired bit size range or an out-of-range type code for the desired bit size such that the combination data indicates a logical combination of a plurality of the codes of the entry that when evaluated results in output that is equivalent to the in-range type code for the desired bit size range or the out-of-range type code for the desired bit size.

19. The method of claim 12, further comprising determining whether or not the entry is hashable by comparing a key_map with the entry, wherein the key_map masks bits of the entry that participates in hashing.

20. The method of claim 12, wherein inserting the entry into one of the SRAM pools includes rehashing to resolve a hash conflict.

21. The method of claim 12, wherein rehashing implements a depth-first insertion algorithm or a breadth-first insertion algorithm.

22. A method of implementing a network switch that includes one or more static random access memory (SRAM) pools and at least one spillover ternary content addressable memory (TCAM) pool, wherein each entry of the one or more SRAM pools includes a code field including one or more codes and a value field including rule comparison data, the method comprising:
with the network switch:
sending a search key to at least one of the one or more SRAM pools and selecting one of the entries within the at least one of the one or more SRAM pools;
evaluating each of the codes of the one of the entries based on the search key and the value field thereby determining which of the codes are satisfied by the search key; and
determining if the search key is a match for the one of the entries based on a combination of the codes that are satisfied by the search key and which of the codes are not satisfied by the search key.

23. The method of claim 22, wherein each of the codes occupies either 2 bytes or 3 bytes of the code field.

24. The method of claim 23, wherein at least one of the codes is an equal-match type code or a not-equal-match type code, the at least one of the codes comprising:
an identifier that distinguishes the at least one of the codes from other types of the codes;
a nibble index that identifies a location of match data to compare within both the search key and the value field; and
a bit length that indicates a number of bits after the location within both the search key and the value field to compare as the data, wherein the at least one of the codes relates to determining if the match data of the search key is the same as the match data from the value field.

25. The method of claim 24, wherein at least another one of the codes is an in- range type code or a not-in-range type code, the at least another one of the codes comprising:
an identifier that distinguishes the at least another one of the codes from the other types of the codes;
a byte index that identifies a location of data relating to a lower boundary of the at least another one of the codes within the value field and a location of target data within the search key; and
an upper boundary field that includes data relating to an upper boundary of the at least another one of the codes, wherein the at least another one of the codes relates to determining if the target data is within or outside of the upper boundary and the lower boundary.

26. The method of claim 25, wherein the at least one of the codes occupies 2 bytes of the code field and the at least another one of the codes occupies 3 bytes of the code field.

27. The method of claim 26, wherein a priority field of each of the entries comprises combination data that indicates what combination of results of evaluating each of the codes of the rule with respect to the search key qualify as the search key matching the entry.

28. The method of claim 27, wherein each of the at least another one of the codes is limited to a predetermined maximum bit size range that is less than a desired bit size range, and further wherein the combination data is based on an in-range type code for the desired bit size range or an out-of-range type code for the desired bit size such that the combination data indicates a logical combination of a plurality of the codes of the entry that when evaluated results in output that is equivalent to the in-range type code for the desired bit size range or the out-of-range type code for the desired bit size.

29. The method of claim 22, wherein configurations of the hybrid WCM table indicate which of the pools are active pools.

30. The method of claim 29, wherein lookups in the one or more active pools are performed simultaneously.

31. The non-transitory computer readable memory structure of claim 28, wherein the search key is a combination of one or more header fields of the packet.

32. The non-transitory computer readable memory structure of claim 28, wherein at least one spillover TCAM stores entries that cannot be inserted into the plurality of SRAM pools due to hash conflicts.

33. A non-transitory computer readable memory structure for use with a network switch, the memory structure comprising:
one or more static random access memory (SRAM) pools;
p1 an SRAM entry table including a plurality of entries, wherein each of the entries comprise:
a code field including one or more codes; and
a value field including rule comparison data; and
a non-transitory computer readable medium storing request interface control logic configured to receive a search key of a packet arriving at the network switch and determine if the search key is a match for one or more of the entries based on which of the codes are satisfied by the search key and which of the codes are not satisfied by the search key.

34. The non-transitory computer readable memory structure of claim 33, wherein each of the codes occupies either 2 bytes or 3 bytes of the code field.

35. The non-transitory computer readable memory structure of claim 34, wherein at least one of the codes is an equal-match type code or a not-equal-match type code, the at least one of the codes comprising:
an identifier that distinguishes the at least one of the codes from other types of the codes;
a nibble index that identifies a location of match data to compare within both the search key and the value field; and
a bit length that indicates a number of bits after the location within both the search key and the value field to compare as the data, wherein the at least one of the codes relates to determining if the match data of the search key is the same as the match data from the value field.

36. The non-transitory computer readable memory structure of claim 35, wherein at least another one of the codes is an in-range type code or a not-in-range type code, the at least another one of the codes comprising:
an identifier that distinguishes the at least another one of the codes from the other types of the codes;

a byte index that identifies a location of data relating to a lower boundary of the at least another one of the codes within the value field and a location of target data within the search key; and an upper boundary field that includes data relating to an upper boundary of the at least another one of the codes, wherein the at least another one of the codes relates to determining if the target data is within or outside of the upper boundary and the lower boundary.

37. The non-transitory computer readable memory structure of claim 36, wherein the at least one of the codes occupies 2 bytes of the code field and the at least another one of the codes occupies 3 bytes of the code field.

38. The non-transitory computer readable memory structure of claim 37, wherein each of the entries further comprise a priority field including combination data that indicates what combination of results of evaluating each of the codes of the rule with respect to the search key qualify as the search key matching the entry.

39. The non-transitory computer readable memory structure of claim 38, wherein each of the at least another one of the codes is limited to a predetermined maximum bit size range that is less than a desired bit size range, and further wherein the combination data is based on an in-range type code for the desired bit size range or an out-of-range type code for the desired bit size such that the combination data indicates a logical combination of a plurality of the codes of the entry that when evaluated results in output that is equivalent to the in-range type code for the desired bit size range or the out-of-range type code for the desired bit size.

40. The non-transitory computer readable memory structure of claim 33, wherein the request interface control logic dispatches the search key to one or more active pools based on configurations of a hybrid wildcard match (WCM) table accessible by the request interface control logic, wherein the configurations identify which of the plurality of the SRAM pools active pools.

41. The non-transitory computer readable memory structure of claim 40, wherein final arbitration takes place to determine which of the one or more active pools has priority to return the results data.

42. The non-transitory computer readable memory structure of claim 41, wherein an an arbitration logic stored on a non-transitory computer readable arbitration memory initial arbitration of all sets of results returned by each SRAM tile of a corresponding SRAM pool of each of the plurality of SRAM pools and returns a first data based on the initial arbitration and priority information for the first data.

43. The non-transitory computer readable memory structure of claim 42, wherein each of the SRAM tiles is associated with a key_map and an entry is hashable when all bits in the entry that participate in hashing are not wildcards and not part of a range, and further wherein the key_map determines which bits in the entry participate in the hashing.

* * * * *